US006767582B1

(12) United States Patent
Elers

(10) Patent No.: US 6,767,582 B1
(45) Date of Patent: Jul. 27, 2004

(54) METHOD OF MODIFYING SOURCE CHEMICALS IN AN ALD PROCESS

(75) Inventor: Kai-Erik Elers, Helsinki (FI)

(73) Assignee: ASM International NV (NL)

( * ) Notice: Subject to any disclaimer, the term of this patent is extended or adjusted under 35 U.S.C. 154(b) by 100 days.

(21) Appl. No.: 10/110,598

(22) PCT Filed: Oct. 12, 2000

(86) PCT No.: PCT/FI00/00884

§ 371 (c)(1),
(2), (4) Date: Apr. 11, 2002

(87) PCT Pub. No.: WO01/27346

PCT Pub. Date: Apr. 19, 2001

(30) Foreign Application Priority Data

Oct. 15, 1999 (FI) .............................. 19992233

(51) Int. Cl.[7] ............................ C23C 16/08
(52) U.S. Cl. ................. 427/253; 427/250; 427/252; 427/255.39; 427/255.391; 427/255.393; 427/255.394; 427/255.395; 427/383.1; 427/383.3
(58) Field of Search ................. 427/250, 252, 427/253, 255.39, 255.391, 255.393, 255.394, 255.395, 383.1, 383.3

(56) References Cited

U.S. PATENT DOCUMENTS

| 4,058,430 A | 11/1977 | Suntola et al. |
| 4,803,127 A | 2/1989 | Hakim |
| 5,342,652 A | 8/1994 | Foster et al. |
| 5,691,235 A | 11/1997 | Meikle et al. |
| 5,711,811 A | 1/1998 | Suntola et al. |
| 5,723,384 A | 3/1998 | Park et al. |

FOREIGN PATENT DOCUMENTS

| EP | 0 899 779 A3 | 3/1999 |
| WO | WO 96/17107 | 6/1996 |

OTHER PUBLICATIONS

Lee, Chi–Young, *"The Preparation of Titanium–Based Thin Film by CVD Using titanium Chlorides as Precursors,"* Chemical Vapor Deposition, vol. 5, No. 2, pp. 69–73 (1999). (No month avail.).

Ritala, M. et al., *"Atomic Layer Epitaxy Growth of TiN Thin Films,"* J. Electrochem. Soc., vol. 142. No. 8. pp. 2731–2737 (1995). (No month avail.).

Elers, Kai–Erik et al., *"$NbCl_5$ as a precursor in atomic layer epitaxy,"* Applied Surface Science, Vols. 82/83, pp.468–474 (1994). (No month avail.).

Hiltunen, L., et al., *"Nitrides of Titanium, Niobium, Tantalum and Molybdenum Grown As Thin Films By The Atomic Layer Epitaxy Method,"* Thin Solid Films, 166:149–154 (1988). (No month avail.).

(List continued on next page.)

*Primary Examiner*—Bernard Planalto
(74) *Attorney, Agent, or Firm*—Knobbe, Martens, Olson & Bear LLP.

(57) ABSTRACT

This invention concerns a method for modifying a source material used in an ALD process, a method for depositing transition metal nitride thin films by an ALD process and apparatus for use in such process. According to the present invention transition metal source materials are reduced by vaporizing a metal source material, conducting the vaporized metal source material, into a reducing zone comprising a solid reducing agent maintained at an elevated temperature. Thereafter, the metal source material is contacted with the solid or liquid reducing agent in order to convert the source material into a reduced metal compound and reaction byproducts having a sufficiently high vapor pressure for transporting in gaseous form.

22 Claims, 2 Drawing Sheets

OTHER PUBLICATIONS

Jeon, H., et al., "A Study on the Characteristics of TiN Thin Film Deposited by Atomic Layer Chemical Vapor Deposition Method," *J. Vac. Sci. Technol. A*, 18(4), 1595–1598 (2000). (No month avail.).

Klaus, J.W., et al., "Atomically controlled growth of tungsten and tungsten nitride using sequential surface reactions," *Appl. Surf. Science* 162–163; 479–471 (2000). (No month avail.).

Klaus, J.W., et al., "Atomic layer deposition of tungsten nitride films using sequential surface reactions," *Journal of the Electrochemical Soc.*, 147 (3):1175–1181 (2000). (No month avail.).

Klaus, J.W., et al., "Atomic layer depostion of tungsten using sequential surface chemistry with a sacrificial stripping reaction," *Thin Solid Films*, 360:145–153 (2000) (No month avail.).

Klaus, J.W., et al., "Atomic layer deposition of tungsten and tungsten nitride using sequential surface reactions," *AVS 46th International Symposium*, Seattle, WA, abstract TF–TuM6 (1999) (No month avail.).

METHOD OF MODIFYING SOURCE CHEMICALS IN AN ALD PROCESS

REFERENCE TO RELATED APPLICATIONS

The present application is the U.S. national phase of international application number PCT/FI00/00884 and claims priority under 35 U.S.C. §119 to Finnish application number 19992233, filed Oct. 15, 1999.

BACKGROUND OF THE INVENTION

1. Field of the Invention

The present invention relates to metal nitride thin films. In particular, the present invention concerns a method of in situ reduction of source chemicals as well as a method of growing of metal nitride thin films. The present invention also relates to an apparatus for growing thin films on a substrate by an ALD type process.

2. Description of Related Art

The integration level of components in integrated circuits is increasing, which rapidly brings about a need for a decrease of the size of components and interconnects. Design rules are setting the feature sizes to $\leq 0.2$ μm. Deposition of uniform thin films on wafer surfaces by Physical Vapor Deposition (referred to as PVD hereinafter) and Chemical Vapor Deposition (referred to as CVD hereinafter) methods has become difficult due to small feature sizes. As a result, complete film coverage on deep bottoms of vias and trenches cannot be obtained. PVD methods require more or less direct line-of-sight on the surfaces to be coated Traditional CVD methods require rather precise concentration control of the source chemicals and good temperature uniformity over the substrate. Deep bottoms may have a local "microclimate" where the variable concentration of source chemical vapors is causing non-uniform growth of thin film.

Integrated circuits contain interconnects which are usually made of aluminium or copper. Especially copper is prone to diffusion to the surrounding materials. Diffusion affects the electrical properties of the circuits and active components may malfunction. The diffusion of metals from interconnects into the active parts of the devices is prevented with an electrically conductive diffusion barrier layer. Favoured diffusion barriers are, e.g., amorphous transition metal nitrides, such as TiN, TaN and WN. The nitrides can be non-stoichiometric because nitrogen is located at interstitial position of the lattice.

Atomic Layer Deposition (ALD), originally, Atomic Layer Epitaxy (ALE) is an advanced variation of CVD. The method name was changed from ALE into ALD to avoid possible confusion when discussing about polycrystalline and amorphous thin films. The ALD method is based on sequential self-saturated surface reactions. The method is described in detail in U.S. Pat. Nos. 4,058,430 and 5,711,811. The reactor benefits from the usage of inert carrier and purging gases which makes the system fast.

The separation of source chemicals from each other by inert gases prevents gas-phase reactions between gaseous reactants and enables self-saturated surface reactions leading to film growth which requires neither strict temperature control of the substrates nor precise dosage control of source chemicals. Surplus chemicals and reaction byproducts are always removed from the reaction chamber before the next reactive chemical pulse is introduced into the chamber. Undesired gaseous molecules are effectively expelled from the reaction chamber by keeping the gas flow speeds high with the help of an inert purging gas. The purging gas pushes the extra molecules towards the vacuum pump used for maintaining a suitable pressure in the reaction chamber. ALD provides an excellent and automatic self-control for the film growth.

In case of transition metal nitrides, reduction of the metal source material is needed in order to increase the amount of metal in the nitride and, thus, to lower the resistivity of the nitride. "Reduction" can be defined as any reaction, wherein the metal of the source chemical receives electrons and its oxidation state decreases.

In the art, it is known to reduce the metal source material by pulsing a reducing agent after the metal source material pulse. A number of different chemicals have been used for the reduction. For example, tungsten compounds have been reduced by using hydrogen ($H_2$) (U.S. Pat. No. 5,342,652 and EP-A2-899 779), silanes such as $SiH_4$ (U.S. Pat. No. 5,691,235) and chlorosilanes such as $SiHCl_3$ (U.S. Pat. No. 5,723,384). Low oxidation-state metal chlorides can also be synthesized by passing a gaseous mixture of hydrogen chloride (HCl) and hydrogen ($H_2$) over a heated metal (U.S. Pat. No. 4,803,127).

Reduction of $WF_6$ into W metal on substrate surfaces by using a silane, $Si_2H_6$, is disclosed by J. W. Klaus (Atomic Layer Deposition of Tungsten and Tungsten Nitride Using Sequential Surface Reactions, *AVS 46$^{th}$ International Symposium*, abstract TF-TuM6, http://www.vacuum.org/symposium/seattle/technical.html, to be presented on the 26$^{th}$ of October, 1999 in Seattle, USA).

There are, however, drawbacks related to these prior art methods. Silanes may also react with $WF_6$, thus forming tungsten silicides, such as $WSi_2$. Hydrogen can reduce a tungsten compound into tungsten metal which has too low vapor pressure for being transported in gas phase onto substrates.

Various metal species adsorbed on substrate surfaces have been reduced with zinc in ALE processes (cf., e.g., L. Hiltunen, M. Leskelä, M. Mäkelä, L. Niinistö, E. Nykänen, P. Soininen, "Nitrides of Titanium, Niobium, Tantalum and Molybdenum Grown as Thin Films by the Atomic Layer Epitaxy Method", *Thin Solid Films*, 166 (1988) 149–154). In the known processes, the additional zinc vapor used during the deposition decreased the resistivity of the nitride film either by increasing the metal-to-nitrogen ratio or by removing oxygen from the films. The known process comprised the following pulsing order: a metal source chemical vapor pulse/an inert gas purge/a zinc vapor pulse/an inert gas purge/a nitrogen source chemical vapor pulse/an inert gas purge. A basic problem related to reduction carried out with the zinc vapor method is that thin films contaminated with zinc metal and its compounds should be avoided in processes used for the manufacture of integrated circuits (referred to as IC hereinafter). Diffusing zinc can destroy the active components of the IC's. Additionally, the low end of the substrate temperature range is probably limited by the volatility of zinc metal and the sticking coefficient of zinc compounds on the surface.

In addition to zinc, hydrogen and magnesium have also been tested as reducing agents in ALE processes. The results have not been promising, Hydrogen is not capable enough of reducing the metal compounds at low substrate temperatures. Magnesium forms on the substrate surface a halide which has a very low vapor pressure and stops film growth. It seems that the applicability of elemental reduction on the substrate surface is rather limited. Few elements have high enough vapor pressure to be used as ALD source chemicals.

Even fewer gaseous elements form a volatile byproduct during the reduction step.

A method for influencing the properties of CVD source chemicals is disclosed by C.-Y. Lee [The Preparation of Titanium-Based Thin Film by CVD Using Titanium Chlorides as Precursors, *Chem. Vap. Deposition*, 5 (1999) 69–73)]. According to the publication, in a CVD process TiCl$_4$ vapor was flowing over titanium metal which was heated to 900° C. The reaction produced TiCl$_x$ (x<4) subchlorides. These subchlorides were downstream thermally decomposed into Ti metal on a substrate which was heated to 500–800° C.

The CVD reducing apparatus described by C.-Y. Lee can not be used in ALD because of the required performance and character of ALD source chemicals and the location of the reducing agent. If a titanium reducing agent is covered by titanium halide molecules and it is exposed to reactive nitrogen containing source chemical like ammonia a layer of very inert titanium nitride will grow on its surface. Thus the formed titanium nitride layer prevents the desired reduction reaction of TiCl$_4$ gas pulses.

SUMMARY OF THE INVENTION

It is an object of the present process to eliminate the problems of prior art and to provide a novel method of reducing metal source materials in an ALD type process. It is another object of the invention to provide a novel method of preparing metal nitride thin films by an ALCVD type method It is a further object of the present invention to provide an apparatus for growing metal nitride thin films by an ALD type method.

These and other objects together with the advantages thereof over known processes are accomplished as hereinafter described and claimed.

The present invention is based on the surprising finding that metal source compounds used in an ALD type process can be reduced at moderate temperatures before being adsorbed or chemisorbed on the surface of a substrate. According to the invention the metal source compounds are therefore conducted in gaseous state into a reduction zone in which they are contacted with a solid or liquid reducing agent maintained at an elevated temperature in order to produce a gaseous reaction product containing the metal species of the metal source compound at a lower state of oxidation. The reduced metal source material is then contacted with the substrate and deposited on it according to the principles of ALD.

In comparison to the modification method for CVD titanium source chemicals described by C.-Y. Lee above, the present in situ reduction is carried out at low temperatures in particular at temperatures close to the actual substrate temperature, whereas in the known CVD method, temperatures of 900° C. were used. As the below examples show, the reduction of the metal source material in the reduction zone and the reaction between the metal source material and the metal species bound to and originating form the surface give rise to gaseous reaction products which easily can be removed from the reduction zone or from the reaction space and which have a sufficiently high vapor pressure for being used as source materials in an ALD process.

Taking titanium chloride as an example, the reduction TiCl$_4$ at 400° C. gives rise to titanium subchlorides, such as Ti$_2$Cl$_6$, which can be transported to the substrate by inert gas. The results are quite surprising, because it has generally been believed that titanium subhalides are not suitable for low-temperature ALD due to low vapor pressure.

The apparatus according to the present invention comprises a reduction zone placed in regard to the flow path of the gaseous reactants which are to be reduced, the reduction zone is placed before the substrate, such that gaseous reactants can be brought into contact with the reduction zone before they are subjected to surface reactions with the substrate. Typical positions are in the flow channel interconnecting the source material containers and the reaction chambers, and in the reaction chambers upstream from the substrates.

In the present invention the reduction zone is placed before the reaction zone. In the apparatus according to C.-Y. Lee [The Preparation of Titanium-Based Thin Film by CVD Using Titanium Chlorides as Precursors, *Chem. Vap. Deposition*, 5 (1999) 69–73)] the reducing zone and the substrate are located in the same space.

In ALD method the thermal decomposition of the source chemicals is prevented by applying low substrate temperature, thus thermal decomposition of low oxidation state titanium chlorides to metal state titanium on the substrate and to halogen molecules in the gas phase is prevented.

According to the present invention the reactivity and clean surface of the reducing agent is ensured by separating the reduction zone and the reaction zone from each other. Thus the metal source chemical pulses contacting the reducing agent always meet a surface capable of changing the oxidation state of the metal source chemicals.

More specifically, the method of reducing a metal source compound is characterized by what is stated in the characterizing part of claim 1.

The method of growing metal nitride thin films is characterized by what is stated in the characterizing part of claim 10.

The apparatus for growing metal thin films on a substrate is characterized by what is stated in the characterizing part of claim 18.

A number of considerable advantages are accomplished with the aid of the invention. The growing rate of the thin film is high, e.g., the growth rate of ALD titanium nitride thin film increased by almost a factor of 2 compared with the processes of the prior art. In addition the invention makes it possible to operate at low temperatures. When the reduction of the metal source material is carried out in situ, in other words, in the reactor system without using a separate reducing agent pulse, no additional reagent for reduction needs to be introduced into the reaction space. Thus, also one purging step is avoided. This leads to shorter cycle times and thus to more efficient growing of the films.

The reduction of the metal source material gives lower resistivity to metal nitride film, since the amount of metal increases with respect to the amount of nitrogen. The present process gives as good reduction properties and thus as good film resistivities as the processes of prior art with a simpler and faster growing procedure.

As mentioned above, the compounds formed as byproducts in the reduction reaction and in the reaction between the metal species on the surface of the substrate are essentially gaseous and they exit the reactor easily when purging with an inert gas. The amount of residues in the film is on a very low level.

A film grown with the present process exhibits good thin film properties. Thus, the metal nitride films obtained have an excellent conformality even on uneven surfaces and on trenches and vias. The method also provides an excellent and automatic self-control for the film growth.

The ALD grown metal nitride films can be used, for example, as ion diffusion barrier layers in integrated circuits. Tungsten nitride stops effectively oxygen and increases the stability of metal oxide capacitors. Transition metal nitrides and especially tungsten nitride is also suitable as an adhesion layer for a metal, as a thin film resistor, for stopping the migration of tin through via holes and improving the high-temperature processing of integrated circuits.

Next, the invention is described in detail with the aid of the following detailed description and by reference to the attached drawing.

DETAILED DESCRIPTION OF THE INVENTION

Definitions

Figure 1:
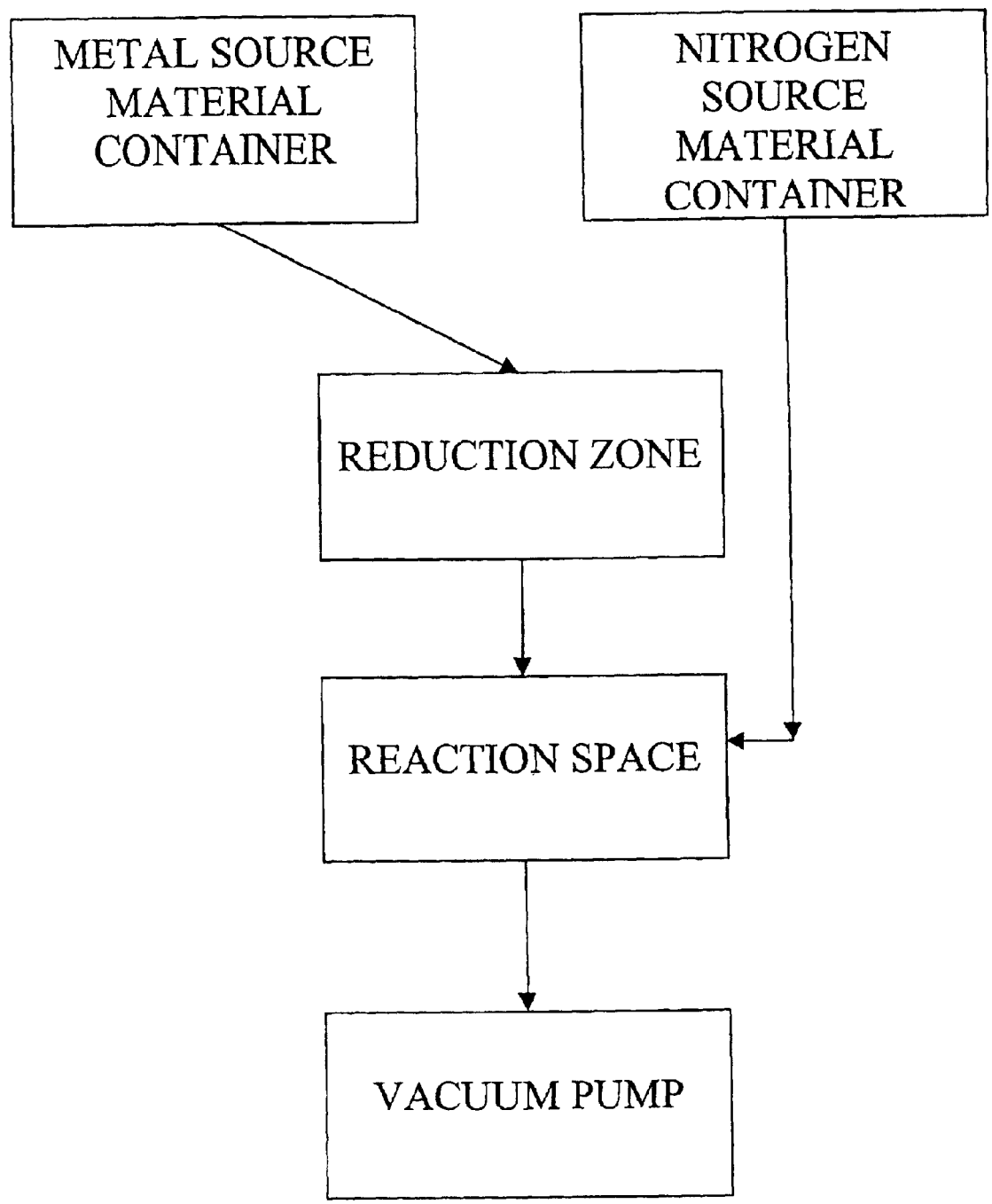
FIG. 1 presents a schematic picture of the preferred arrangement of the present invention.
Figure 2:
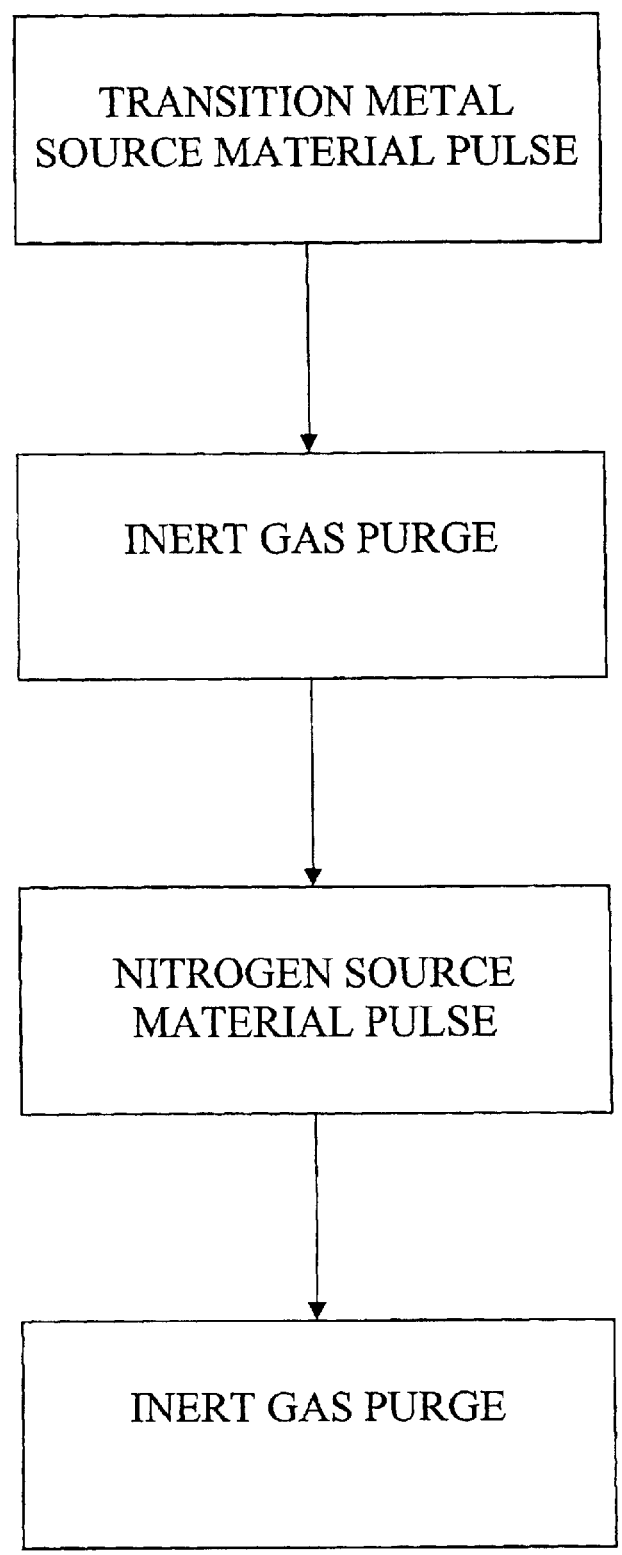
FIG. 2 illustrates the preferred pulsing sequence in the growing of nitride thin films according to the present invention.

For the purposes of the present invention, an "ALD type process" designates a process in which deposition of vaporized material onto a surface is based on sequential and alternating self-saturating surface reactions. The principles of ALD are disclosed, e.g., in U.S. Pat. Nos. 4,058,430 and 5,711,811.

"Reaction space" is used to designate a reactor or reaction chamber in which the conditions can be adjusted so that deposition by ALD is possible.

"Reduction zone" designates an area or space in which the reducing agent is arranged and over or through which the material to be reduced is conducted to flow.

"Thin film" is used to designate a film which is grown from elements or compounds that are transported as separate ions, atoms or molecules via vacuum, gaseous phase or liquid phase from the source to the substrate. The thickness of the film depends on the application and it varies in a wide range, e.g., from one molecular layer to 800 nm or even up to 1000 nm.

The Deposition Process

According to the present invention metal nitride thin films are prepared by the ALD process. Thus, a substrate placed in a reaction chamber is subjected to alternately repeated surface reactions of at least two vapor-phase reactants for the purpose of growing a thin film thereon. Metal compounds used as source materials for the thin film metal are reduced by a solid or liquid reducing agent when conducted through the reduction zone in which the reducing agent is located. Thereafter, the reduced compounds are deposited on a substrate maintained at an elevated temperature. A subsequently fed pulse of a gaseous or volatile nitrogen source material reacts with the deposited metal species forming a metal nitride.

According to the present invention, vapor-phase pulses of the metal source material and the nitrogen source material are preferably fed into the reactor with the aid of an inert carrier gas, such as nitrogen.

Preferably, and to make the reaction faster, each feeding pulse is followed by an inert gas pulse to purge the reduction zone and the reaction space, respectively, from unreacted residues of the previous chemical and from the byproducts formed in the reduction and/or the sure reaction. This allows for using highly reactive chemicals and, thus, lower deposition temperatures. The inert gas pulse, also referred to as "gas purge" comprises an inactive gas, such as nitrogen, or a noble gas, such as argon.

Thus, one pulsing sequence (also referred to as a "cycle"), comprising a reduction step, preferably includes the following features:

providing a vapor-phase pulse of a metal source material;

feeding the vapor-phase metal source pulse into a reduction zone comprising a solid or liquid reducing agent having a low vapor pressure;

contacting the metal source material with the reducing agent in order to reduce the metal source material into a reduced gas phase source material pulse;

recovering the reduced gas phase source material and conducting it into a reaction chamber;

contacting the reduced gas phase material with a substrate surface in order to deposit a metal species on the surface;

purging the reaction space with an inert gas;

feeding a vapor-phase pulse of a nitrogen source material into the reaction chamber;

contacting the nitrogen source material with the metal species on the surface of the substrate in order to form a metal nitride; and purging the reaction space with an inert gas.

The metal source material flows over the reducing agent and becomes reduced before adsorbing or chemisorbing on a heated substrate surface. The reducing agent is heated to approximately 200–800° C., preferably to 300–500° C. As mentioned above, the reduction temperature is preferably close to the actual deposition temperature. The temperature is dependent on the metal material, for example for the reduction of $TiCl_4$ on Ti, the temperature of the reducing agent is preferably approximately 400° C., however, preferably lower than the substrate temperature. Deposition of the reduced titanium compound can be carried out at 350 to 400° C.

A successful reduction process requires that non-reduced source chemical be in gaseous state. The reducing agent has a reactive surface which preferably stays essentially uncontaminated during the process and the reaction products do not accumulate on the surface of the reducing agent. This is facilitated by selecting the metal source material and reducing agent pair so that reduced source chemical has sufficiently high vapor pressure for transporting. In addition, the byproducts of the reduction should preferably have sufficient vapor pressure to be purged away, and be relatively inert. As a non-limiting example, silicon and boron can react with high oxidation state metal halide gases forming low oxidation state metal halides. Non-metal halide vapors, such as $SiF_4$, $SiCl_4$, $BF_3$ and $BCl_3$, that are formed in the reactions as by-products can be purged away from the reactor with an inert gas.

The deposition of the source material(s) on the substrate surface can be carried out at normal pressure, but it is preferred to operate the method at reduced pressure. The pressure in the reaction space is typically 0.01–20 mbar, preferably 0.1–5 mbar. The substrate temperature has to be low enough to keep the bonds between metal atoms intact and to prevent decomposition of the gaseous reactants. On the other hand, the substrate temperature has to be high enough to keep the source materials in gaseous phase, i.e., condensation of the gaseous reactants must be avoided.

Further, the temperature must be sufficiently high to provide the activation energy for the surface reaction. Depending on the pressure, the temperature of the substrate is typically 200–700° C., preferably at 250–500° C.

At these conditions, the amount of reactants bound to the surface will be determined by the surface. This phenomenon is called "self-saturation".

Maximum coverage on the substrate surface or on the surface of the growing film is obtained when a single layer of reduced metal source chemical molecules or a single layer of nitrogen source chemicals is adsorbed. The pulsing sequence is repeated until a metal nitride film of predetermined thickness is grown.

The source temperature is preferably set below the substrate temperature. This is based on the fact that if the partial pressure of the source chemical vapor exceeds the condensation limit at the substrate temperature, controlled layer-by-layer growth of the film is lost The time available for the self-saturated reactions is limited mostly by economical factors such as required throughput of a product from the reactor. Very thin films are made by relatively few pulsing cycles and, in some cases, this enables an increase of the source chemical pulse times and, thus, utilization of source chemicals with a lower vapor pressure than normally.

The purging time has to be long enough to prevent gas phase reactions and to prevent transition metal nitride thin film growth rates higher than one lattice constant of said nitride per pulsing sequence.

Reducing Agents

The reducing agent is preferably solid. Most suitable are elemental reducing agents, either metals or reactive non-metals. According to a preferred embodiment of the invention the reducing agent is a metal, preferably the same metal as the metal component of the source material, but naturally it is possible to use some other suitable reducing metal as well. The metal is preferably a transition metal of group 4, 5 or 6, i.e., Ti, Zr, Hf, V, Nb, Ta, Cr, Mo or W. The reactive non-metals preferably used as reducing agents comprise B, Si, Ge and P. It is also possible to employ some reactive metal compounds such as metal silicides or germanides as reducing agents. Silicon and germanium halides typically formed as byproducts in the reduction are volatile and can be purged away from the reducing zone.

The reducing agent can, however, be liquid. It is important that the vapor pressure of the liquid reducing agent is low so that it will not enter into the reaction space and hamper the reactions of the source materials with the substrate surface. An example of a suitable liquid reducing agent is gallium metal, which melts at approximately 30° C. and has a boiling point of approximately 2400° C.

The Reactor System

Generally, the apparatus according to the present invention can be any type of an ALD reactor to which a reduction zone comprising the solid reduction agent has been added. Such an apparatus typically comprises reaction space into which the substrate can be placed, e.g. on a holder or jig, and at least one inlet flow channel which can be connected to a metal source material container for allowing feed of a metal source material in the form of vapor-phase pulses from a metal source material container into the reaction space. There is typically also at least one outlet flow channel connected to the reaction space for removal of gas phase reaction products. According to the present invention, a reactor of the above described construction is modified by incorporating a reduction zone at a point along the gas flow path of the gaseous reactant.

A schematic picture of the preferred reduction arrangement according to the present invention is depicted in FIG. 1. According to this preferred arrangement, the reduction zone is located between the metal source material container and the substrate of the reaction space. The nitrogen source material can be fed to the reaction space either through the same flow channel or through a different flow channel. The nitrogen source material is not reduced in the reduction zone.

Typically the reduction zone is located in the gas flow channel situated between the source material stock container and the reaction space, preferably just before the reaction space (also referred to as substrate chamber). In such an arrangement, the reducing agent is typically present in the form of a cartridge. It is also possible to coat the flow channel leading from the metal source material stock container to the reaction space with reducing material. In such an arrangement, the flow channel is then heated to a temperature which is needed for the reduction reaction of the source material to take place, for example, for titanium at approximately 350–400° C.

Another embodiment of the invention comprises fitting the reducing agent into the reaction space, essentially upstream to the substrate. In such an arrangement the reducing agent is typically shaped as a monolithic block.

In both cases it is important to be able to remove the reducing agent and/or the container thereof for regeneration and/or refill as easily as possible.

Substrate Materials

The substrate can be of various types. Examples include silicon, silica, coated silicon and copper metal. The present film-growing process provides an excellent method for growing of conformal layers in geometrically challenging applications.

Metal Source Materials

The invention can be applied especially to the reduction of transition metal chemicals, i.e., elements of groups 3, 4, 5, 6, 7, 8, 9, 10, 11 and/or 12 (according to the system recommended by IUPAC) in the periodic table of elements, because these metals can form compounds of several different oxidation states. In particular, the deposited film consists essentially of W, Ti, Zr, Hf. V, Nb, Ta, Cr, and/or Mo nitride(s) and, thus, gaseous or volatile compounds of these are preferably used in the method of the present invention.

Particularly preferred are compounds of tungsten and titanium. Preferably, a tungsten source material is used.

Since the properties of each metal compound vary, the suitability of each metal compound for the use in the process of the present invention has to be considered. The properties of the compounds are found, e.g., in N. N. Greenwood and A. Earnshaw, *Chemistry of the Elements*, 1$^{st}$ edition, Pergamon Press, 1986.

The metal source material (as well as the reducing boron compound and the nitrogen source material) has to be chosen so that requirements for sufficient vapor pressure, the above-discussed criteria of sufficient thermal stability at substrate temperature and sufficient reactivity of the compounds are fulfilled.

Sufficient vapor pressure means that there must be enough source chemical molecules in the gas phase near the substrate surface to enable fast enough self-saturated reactions at the surface.

In practice sufficient thermal stability means that the source chemical itself must not form growth-disturbing condensable phases on the substrates or leave harmful levels of impurities on the substrate surface through thermal decomposition. Thus, one aim is to avoid non-controlled condensation of molecules on substrates.

Further selecting criteria may include the availability of the chemical in a high purity, and the easiness of handling, inter al., reasonable precautions.

In addition, the quality of the products of the reduction reaction and its byproducts needs to be considered, since the controlled process is lost if an inert metal boride, phosphide or carbide layer is formed on the reducing agent. Thus it is important that the reaction product be essentially gaseous. By this it is meant that the compound formed is gaseous enough to be moved from the reaction space with the aid of the inert purging gas, which means that they will not remain as impurities on the reducing agent or in the films.

Typically suitable metal source materials can be found among halides, preferably fluorides, chlorides, bromides or iodides, or metal organic compounds, preferably alkylaminos, cyclopentadienyls, dithiocarbamates or betadiketonates of desired metal(s).

Most common volatile transition metal halides of groups 4, 5 and 6 of the periodic table of elements that have potential as source chemicals for the reduction method are $TiCl_4$, $TiBr_4$, $TiI_4$, $ZrCl_4$, $ZrBr_4$, $ZrI_4$, $HfCl_4$, $HfBr_4$, $HfI_4$, $WF_6$, $WCl_6$, $WBr_6$, $TaF_5$, $TaCl_5$, $TaBr_5$, $NbF_5$, $NbCl_5$, $NbBr_5$, $VF_5$ and $VCl_4$.

According to a preferred embodiment transition metal nitrides are mixed so that in the growing process two or more different metal source materials are used. For example, tungsten nitride can be mixed with titanium nitride.

The reduced metal reactant will react with the substrate surface forming a (covalent) bond to the surface bonding groups. The adsorbed metal species will contain a residue of the reactant compound, such as a halogen or hydrocarbon. It is assumed that this residue reacts with a nitrogen-containing compound.

Nitrogen Materials

The nitrogen compound used as the nitrogen source material is volatile or gaseous and chosen bearing in mind the same criteria as for the metal source material. In general, the nitrogen compound can be any volatile, thermally sufficiently stable nitrogen compound capable of reacting with the metal species bound on the surface at the reaction conditions.

The reactions of different metal source materials with one and same nitrogen source material (and vice versa) can lead to different reaction (by)products. According to the present invention, the metal source material and nitrogen source material are selected so that the resulting byproduct(s) is (are) gaseous. By this it is meant that the compound formed is gaseous enough to be moved from the reaction space with the aid of the inert purging gas, and, on the other hand, does not catalytically decompose to condensable species. According to the present invention, byproducts will not remain as impurities in the films. If a reactive site on the surface is contaminated, the growing rate of the film decreases. By selecting the metal source material(s) and boron compound as indicated above, the growing rate of the film does not essentially decrease, i.e., decreases by a maximum of 0.1%, preferably by less than 0.01%, and in particular by less than 0.001% in each cycle.

The selection can be facilitated with computer programs having a sufficiently extensive thermodynamics database, which enables to check the reaction equilibrium and thus predict which reactants have thermodynamically favourable reactions. An example of this kind of programs is HSC Chemistry, version 3.02 (1997) by Outokumpu Research Oy, Pori, Finland.

Preferably, the nitrogen compound is selected from the group comprising ammonia ($NH_3$) and its salts, preferably halide salt, in particular ammonium fluoride or ammonium chloride;

hydrogen azide ($HN_3$) and the alkyl derivates of the said compound such as $CH_3N_3$;

hydrazine ($N_2H_4$) and salts of hydrazine such as hydrazine hydrochloride;

alkyl derivates of hydrazine such as dimethyl hydrazine;

nitrogen fluoride $NF_3$;

hydroxyl amine ($NH_2OH$) and its salts such as hydroxylamine hydrochloride;

primary, secondary and tertiary amines such as methylamine, diethylamine and triethylamine; and nitrogen radicals such as $NH_2$, $NH$ and $N***$, in which * means a free electron capable of bonding, and excited state of nitrogen ($N_2*$).

The following non-limiting examples illustrate the invention:

EXAMPLE 1

Experiments were performed with an F200 ALD reactor, as described in Finnish Patent No. 100409 of assignee by Suntola et al. Two series of titanium nitride samples were produced. One series of samples was made from $TiCl_4$ and $NH_3$. Heated reactor parts in contact with metal halides were passivated with amorphous aluminium oxide which protected the parts against corrosion $TiCl_4$ was evaporated from a source bottle at room temperature. The source gas was carried to the substrate chamber by nitrogen gas. Purging with nitrogen gas removed surplus $TiCl_4$ molecules from the reactor. Then an $NH_3$ gas pulse was introduced to the substrate chamber. The pulsing cycle was ended with a nitrogen purge which removed surplus $NH_3$ and gaseous reaction byproducts from the reactor. The pulsing cycle was repeated 1000 times. The pressure of the substrate chamber was in the range of 200–1000 Pa. The resulting thin film on silicon wafer had metallic lustre with a yellowish hue. The growth rate at 400° C. was 0.17 Å/cycle.

Another series of samples was grown from $TiCl_4$ and $NH_3$ with titanium metal (referred to as TiN—Ti hereinafter). $TiCl_4$ was evaporated from a source bottle at room temperature. The $TiCl_4$ vapor was carried towards the substrate chamber by nitrogen gas. In the gas flow channel near the substrate chamber there was titanium metal heated to 400° C. $TiCl_4$ flowed over titanium metal and the reaction products denoted with $TiCl_x$ were carried to the substrate chamber by nitrogen gas. Nitrogen purge removed surplus $TiCl_x$ molecules from the substrate chamber. Then $NH_3$ gas pulse was introduced to the substrate chamber. The pulsing cycle was ended with a nitrogen purge which removed surplus $NH_3$ and gaseous reaction byproducts from the reactor. The pulsing cycle was repeated 1000 times. The resulting thin film on silicon wafer had metallic lustre with a yellowish hue. The thickness of the thin film was measured by Electron Diffraction Spectroscopy (referred to as EDS hereinafter). A growth rate was calculated by dividing the thickness by the number of pulsing cycles. The growth rate of the TiN—Ti film at 400° C. (0.31 Å/cycle) was almost doubled compared to TiN samples (0.17 Å/cycle) that were grown with equal deposition parameters without titanium metal. There was chlorine in the films as an impurity but the concentration stayed below 1.5 wt.-%. When the growth temperature was decreased from 400° C. to 350° C., the amount of chlorine increased to 4.0 wt.-% and the resistivity increased from 200 $\mu\Omega$cm to 450 $\mu\Omega$cm. Using titanium metal did not affect the chlorine content of the film.

Exact reactions of $TiCl_4$ on titanium metal and the composition of the resulting $TiCl_x$ source chemical vapor are to be argued. One possible reaction, which is thermodynamically favourable, is presented in Eq. 1. A dimer $(TiCl_3)_2$ or written as $Ti_2Cl_6$ which chemisorbs on substrate surface may explain the increased growth rate of the nitride film. If the number of reactive surface sites (e.g. $-NH_2$ and $=NH$ groups) on TiN and TiN—Ti is the same, molecules with higher metal/halide ratio will add more metal per pulsing cycle on the surface than metal compounds of high oxidation state. The reaction equation (Eq. 2), which describes the nitride formation, is thermodynamically favourable. The free Gibbs energy value must be assessed with care because data regarding adsorbed molecules was not available for calculations.

$$3TiCl_4(g)+Ti(s) \rightarrow 2(TiCl_3)_2(g) \quad \Delta G(400°\ C.)=-121\ kJ \quad (Eq.\ 1)$$

$$(TiCl_3)_2(g)+2NH_3(g) \rightarrow 2TiN(s)+6HCl(g) \quad \Delta G(400°\ C.)=-73\ kJ \quad (Eq.\ 2)$$

EXAMPLE 2

The same ALD reactor as in Example 1 was used for the reduction experiment. $WF_6$ was evaporated from a source bottle at room temperature and carried towards the substrate chamber by nitrogen gas. In the gas flow channel near the substrate chamber there was tungsten metal foil heated to 400° C. $WF_6$ flowed over tungsten metal, and the assumed reaction products (denoted with $WF_x$) were carried to the substrate chamber by nitrogen gas. However, it was not possible to detect any visual signs of corrosion on W metal after the experiment. Theoretical calculations confirmed that at least simple reactions Eq. 3 and Eq. 4 are not favourable thermodynamically.

$$5WF_6(g)+W \rightarrow 6WF_5(g) \quad \Delta G(400°\ C.)=+1753\ kJ \quad (Eq.\ 3)$$

$$2WF_6(g)+W \rightarrow 3WF_4(g) \quad \Delta G(400°\ C.)=+79\ kJ \quad (Eq.\ 4)$$

THEORETICAL EXAMPLE 3

Tungsten hexafluoride ($WF_6$) is evaporated from the source bottle and carried towards the substrate chamber by nitrogen gas. Along the gas route there is a cartridge filled with tungsten silicide pieces. The cartridge is heated to 400° C. The reduction of $WF_6$ into $WF_4$ is thermodynamically favourable (Eq. 5). The pulsing sequence in the point of substrate is as follows: $WF_x$ vapor pulse/$N_2$ gas purge/$NH_3$ vapor pulse/$N_2$ gas purge.

$$6WF_6(g)+WSi_2(s) \rightarrow 7WF_4(g)+2SiF_4(g) \quad \Delta G(400°\ C.)=-737\ kJ \quad (Eq.\ 5)$$

It can be argued whether $SiF_4$ disturbs the thin film growth process. However, experiments with ALE have shown that it is very difficult to grow any silicon oxide or silicon nitride film from silicon halides. $SiF_4$ molecules may have low reactivity with $NH_3$ gas and they can be purged away with nitrogen.

EXAMPLE 4

The effect of tungsten on the on the growth of titanium nitride thin film was experimented in an ALD reactor similar to the ones used in Examples 1 and 2. Heated source vapor flow channels before the reaction chamber were coated with tungsten metal. Titanium nitride deposition cycle consisted of the following steps: $TiCl_4$ vapor pulse/$N_2$ gas purged/$NH_3$ vapor pulse/$N_2$ gas purge. The deposition cycle was repeated 500 times. Source chemical vapor pulses flowed through the tungsten-coated flow channels at 350–400° C. The thin film deposited at 350 and 400° C. had improved growth rate and decreased resistivity compared to samples grown without the use of tungsten metal. According to the electron diffraction spectroscopy (EDS) the thin film consisted of titanium and nitrogen. No tungsten in the film was found by EDS.

What is claimed is:

1. A method of reducing transition metal source materials and using them in an atomic layer deposition process, said method comprising:

vaporizing a metal source material;

conducting the vaporized metal source material into a reducing zone located in a flow channel connected to a reaction space, said reducing zone comprising a reducing agent maintained at an elevated temperature;

reducing the vaporized metal source material into a reduced metal compound that can be transported in gaseous form by contacting the vaporized metal source material with the reducing agent;

transporting the reduced metal compound into the reaction space; and utilizing the reduced metal compound in an atomic layer deposition process.

2. The method of claim 1, wherein the reducing agent is a metal.

3. The method of claim 2, wherein the reducing agent is selected from the group consisting of Ti, Zr, Hf, V, Nb, Ta, Cr, Mo and W.

4. The method of claim 2, wherein the reducing agent is the same metal as the metal in the metal source material.

5. The method of claim 2, wherein the reducing agent is a different metal from the metal in the metal source material.

6. The method of claim 1, wherein the reducing agent is a reactive compound selected from the group consisting of B, Si, Ge, P, metal silicides and metal germanides.

7. The method of claim 1, wherein reducing the metal source material is carried out at a temperature close to the growth temperature of the subsequent atomic layer deposition process.

8. An atomic layer deposition process for producing transition metal nitride thin films on a substrate, comprising contacting a substrate in a reaction space with sequential, alternating vapor-phase pulses of:

a) at least one metal source material; and b) at least one nitrogen source material, wherein the metal source material is reduced in a reducing zone located in a flow channel between a metal source material stock container and the reaction space prior to contacting the substrate.

9. An atomic layer deposition process for growing a transition metal nitride thin film on a substrate comprising:

a) feeding a vapor-phase pulse of metal source material into a reduction zone;

b) reducing the vapor-phase metal source material;

c) conducting the reduced vapor-phase metal source material into a reaction space;

d) contacting the reduced vapor-phase metal source material with a substrate in the reaction space to deposit a monolayer of a metal species on the substrate surface;

e) purging the reaction space with an inert gas;

f) feeding a vapor-phase pulse of a nitrogen source material into the reaction space;

g) contacting the nitrogen source material with the metal species on the substrate surface to form a metal nitride;

h) purging the reaction space with an inert gas; and i) repeating steps a) through h) until a metal nitride thin film of a desired thickness is formed.

10. The process of claim 9, wherein the reduction zone comprises a solid or liquid reducing agent maintained at an elevated temperature.

11. The process of claim 10, wherein the reducing agent is maintained at about the same temperature as the substrate.

12. The process of claim 10, wherein in b) reducing the vapor-phase metal source material with the reducing agent comprises conducting the vapor-phase metal source material over the solid or liquid reducing agent maintained at an elevated temperature.

13. The process of claim 9, wherein the metal source material is a compound comprising a transition metal selected from the group consisting of transition metals of group 4, group 5 and group 6 of the periodic table of the elements.

14. The process of claim 13, wherein the metal source material is a compound comprising a transition metal selected from the group consisting of Ti, Zr, Hf, Nb, Ta, Cr, Mo and W.

15. The process of claim 13, wherein the metal source material is a metal halide.

16. The process of claim 15, wherein the metal halide is selected from the group consisting of metal fluorides, metal chlorides, metal bromides and metal iodides.

17. The process of claim 15, wherein the metal source material is a titanium halide.

18. The process of claim 17, wherein the metal source material is $TiCl_4$.

19. The process of claim 13, wherein the metal source material is a metal organic compound selected from the group consisting of alkylaminos, cyclopentadienyls, dithiocarbamates and betadiketonates.

20. The process of claim 9, wherein the nitrogen source material is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride $NF_3$, hydroxyl amine ($NH_2OH$) and salts thereof, primary, secondary and tertiary amines, and nitrogen radicals.

21. The process of claim 20, wherein the nitrogen source material is selected from the group consisting of ammonium fluoride, ammonium chloride, $CH_3N_3$, hydrazine hydrochloride, dimethyl hydrazine, hydroxylamine hydrochloride, methylamine, diethylamine and triethylamine.

22. The process of claim 9, wherein the transition metal nitride comprises a diffusion barrier in an integrated circuit.

* * * * *

UNITED STATES PATENT AND TRADEMARK OFFICE
CERTIFICATE OF CORRECTION

PATENT NO. : 6,767,582 B2  Page 1 of 1
APPLICATION NO. : 10/110598
DATED : July 27, 2004
INVENTOR(S) : Elers It is certified that error appears in the above-identified patent and that said Letters Patent is hereby corrected as shown below:

On title page
On page 1, col.2, under "Primary Examiner", please delete "Planalto" and insert --Pianalto-- therefor.
On page 2, col. 2, line 3, please delete "depostion" and insert --deposition-- therefor.
In Col. 1, line 31, after "coated" please insert --.--.
In Col.2, line 17, please delete "EP-A2-889 779" and insert -- EP-A2-0 889 779 -- therefor.
In Col. 2, line 61, after "promising" please delete "," and insert --.-- therefor.
In Col. 3, line 29, after "method" please insert --.--.
In Col. 3, line 51, after "temperatures" please insert --,--.
In Col. 4, line 2, after "in" please insert --contact with both the reaction space and with the sources of metal compunds. Having--.
In Col. 4, line 43, after "addition" please insert --,--.
In Col. 6, line 1, please delete "sure" and insert --surface-- therfor.
In Col. 7, line 18, after "lost" please insert --.--.
In Col. 7, line 42, after "compounds" please insert --,--.
In Col. 8, line 47, after "Hf" please delete "." and insert --,--,therefor.
In Col. 9, line 13, after "Thus" please insert --,--.
In Col. 12, line 4, please delete "purged/NH$_3$" and insert --purge/NH$_3$--, therefor.

Signed and Sealed this

Eighth Day of August, 2006

JON W. DUDAS
*Director of the United States Patent and Trademark Office*